(12) United States Patent
Virtanen et al.

(10) Patent No.: US 9,634,222 B2
(45) Date of Patent: Apr. 25, 2017

(54) HIGHLY CONDUCTING MATERIAL

(71) Applicants: Jorma Virtanen, Las Vegas, NV (US); Veijo Kangas, Jyvaskyla (FI)

(72) Inventors: Jorma Virtanen, Las Vegas, NV (US); Veijo Kangas, Jyvaskyla (FI)

( * ) Notice: Subject to any disclaimer, the term of this patent is extended or adjusted under 35 U.S.C. 154(b) by 0 days.

(21) Appl. No.: 14/900,124

(22) PCT Filed: Jun. 18, 2014

(86) PCT No.: PCT/US2014/043037
§ 371 (c)(1),
(2) Date: Dec. 18, 2015

(87) PCT Pub. No.: WO2015/047483
PCT Pub. Date: Apr. 2, 2015

(65) Prior Publication Data
US 2016/0141483 A1 May 19, 2016

(30) Foreign Application Priority Data

Jun. 19, 2013 (FI) .................................. 20130175

(51) Int. Cl.
| H01B 5/14 | (2006.01) |
| H01L 39/00 | (2006.01) |
| H01B 5/00 | (2006.01) |
| H01L 39/12 | (2006.01) |

(52) U.S. Cl.
CPC ............ *H01L 39/005* (2013.01); *H01B 5/00* (2013.01); *H01B 5/14* (2013.01); *H01L 39/121* (2013.01)

(58) Field of Classification Search
CPC ................................................ H01B 5/00–5/14
See application file for complete search history.

(56) References Cited

U.S. PATENT DOCUMENTS

| 2008/0203380 A1* | 8/2008 | Wang ..................... B82Y 10/00 257/9 |
| 2009/0224230 A1* | 9/2009 | Pesetski ................. B82Y 10/00 257/24 |
| 2011/0204310 A1* | 8/2011 | Strachan ................ B82Y 10/00 257/2 |
| 2013/0119348 A1* | 5/2013 | Zhou ..................... H01L 29/775 257/29 |

FOREIGN PATENT DOCUMENTS

KR    1020080069995 A    7/2008

* cited by examiner

*Primary Examiner* — Colleen Dunn
(74) *Attorney, Agent, or Firm* — Marger Johnson

(57) ABSTRACT

The present invention concerns electrically conductive nanocomposites. More specifically the electrical conductance of graphitic material can be improved significantly by a molecular coating that has well defined repeating structure. Even superconductivity of these materials may be possible at technologically meaningful temperatures.

16 Claims, 7 Drawing Sheets

A. 
B. 
C. 
D. 
E. 
F. 
G.

HIGHLY CONDUCTING MATERIAL

BACKGROUND AND PRIOR ART

Electrically conducting materials include metals, such as silver, copper, mercury, and aluminum, ceramics, such as yttrium barium copper oxide, and conducting polymers. Part of the electrical energy is transformed into heat during conduction process. The thermal power loss is potential times current.

Carbon nanotubes (CNTs) are excellent conductors at room temperature. Actually, a single CNT is much better electric conductor than silver at room temperature. However, fabrication of macroscopic material that has good electrical conductance has been difficult. Recently well conducting CNT fiber was fabricated by pulling CNTs out of chlorosulfuric acid solution. That fiber had specific resistance about 20 µΩcm, i.e, more than ten times bigger resistance than silver. Film that was fabricated similarly had ten times bigger resistance than the fiber (Behabtu N, et al., Strong, light, multi-functional fibers of carbon nanotubes with ultrahigh conductivity, Science 339 (2013) 182).

Previously we have found that CNT-xylan nanocomposite is very good conductor (Virtanen J. A, and Moilanen P., PCT/FI2010/000077). However, it was very big surprise to observe that DWNT-xylan may be a room temperature superconductor, or at least has some properties of a superconductor.

Single-, and multiwall carbon nanotubes (SWNT and MWNT) have been dispersed into water using water soluble xylan (Kitamura Shinichi, et al., US Patent Application 20090148573, and US2010224836). Reported conductivities are modest, or low. The present inventors were unable to observe any superconducting properties using SWNT or MWNT with xylan. However, it might be possible to modify xylan so that SWNTs and MWNTs become superconducting, and/or find chiral SWNTs or MWNTs that may become superconducting. Also other types of dispersion agents may be found that will produce superconducting compositions.

Some materials become superconductors, when cooled below critical temperature $T_c$. Mercury was found to be superconducting 1907 by Kamerlingh Onnes. $T_c$ for mercury is about 4 K that is impractical for industrial purposes. Very slowly $T_c$ was increased to about 23 K with the introduction of niobium alloys. From practical point of view 23 K does not bring great advantage over 4 K, because liquid helium is required for cooling in both cases. However, at the same time the critical magnetic field increased significantly. This allowed the fabrication and use of superconducting magnets.

Next breakthrough came 1984, when Berndoz and Muller discovered lanthanum based cuprate perovskite that has $T_c$ of about 35 K. Other ceramic superconductors have since been discovered, and currently the highest $T_c$ is about 120 K. These superconductors work at liquid oxygen, or nitrogen temperatures that has opened possibility for some interesting applications, such as levitated trains. However, ceramic superconductors have found limited practical use. One reason is that they are fragile. Even after 30 years the superconducting mechanism of these high $T_c$ ceramic superconductors is not well understood, although spin density wave theory is gaining support.

Theoretically two major mechanisms have been proposed for superconductors (M. Tinkham, Introduction to Superconductivity: Second Edition, Dover Books on Physics, 2004, and High-Temperature Superconductivity, Eds. V. L. Ginzburg, and D. A. Kirzhnits). In both mechanisms the charge carrier is a Cooper pair, i.e., two electrons form a pair that does not have spin. Cooper pair is a boson, while single electron is a fermion. Many bosons can occupy the same state, and form a collective wave. In order the two electrons to be bound into a Cooper pair attractive force should be provided. In Bardeen Cooper Schiefer (BSC) theory that force is provided by phonons, i.e., coordinated movement of atomic nuclei. According to BCS theory the upper limit for phononic superconductivity is about 30 K. In 1964 W. Little proposed alternative model, in which the Cooper pair is stabilized by exciton wave in conducting polymers that have polarizable side chains, i.e., electronic movements in the side chains (W. A. Little, "possibility of Synthesizing of Organic Superconductor", Phys. Rev., 134A (1964) 1416).

Ginzburg, et al., have developed theories about high temperature (40 K<$T_c$<90 K) and room temperature superconductivity. According to Ginzburg two and quasi two dimensional conducting structures such as thin films, fibers, and tubes could be superconducting at room temperature, if they are surrounded by a thin layer of polarizable material that is strongly coupled with conducting layer. Even then Ginzburg predicted that the highest possible $T_c$ is about 300 K that is just above room temperature.

Occasionally, room temperature superconducting behavior has been claimed, but other scientists have not been able to repeat these results, or so small volume of the sample might have been superconducting that it has no practical importance so far (E. J. Eck, U.S. 61/630,114). Two recent publications are especially relevant in this context, because they claim superconducting domains in graphite in the presence of water (Scheike T., et al., "Can Doping Graphite Trigger Room Temperature Superconductivity?", Advanced Materials, 24 (2012) 5826), or hydrocarbons (Y. Kawashima, AIP Adv., 3, online May 24, 2013).

The present inventors studied various proposed theories, and possible practical solutions. Although these were useful guidelines, and explain how the present invention was conceived, these theoretical considerations should not be limiting the practical embodiments of the present invention. As a reminder, BSC model was proposed about 50 years after original discovery of superconductivity, and ceramic high $T_c$ superconductivity has not yet been fully explained. The inventors decided to study one dimensional or quasi two-dimensional conductors, as proposed by Little and Ginzburg. Carbon nanotubes seem to be ideal starting point. At room temperature the superconducting electrons should have wavelength of about 1 nm or less. Zig-zag CNTs have an axial lattice constant of 0.246 nm Multiples of this are 0.49 nm, 0.74 nm, and 0.98 nm. Armchair CNTs have an axial lattice constant of 0.426 nm. Twice of that may be important in this context, i.e., 0.85 nm. Fermi wavelength of electrons in CNTs is about 0.8-0.9 nm Superconducting electrons have higher kinetic energy than Fermi surface electrons, and shorter wavelength, although smaller overall energy. Thus, the wavelength of spin density wave might reasonable be 0.74 nm, i.e., epitaxial with zig-zag CNT. In this model each 0.74 nm segment of a CNT is occupied by one Cooper pair (boson) on the average. Also armchair segment 0.85 nm seems to be reasonable, if the Fermi wavelength is near the upper limit 0.9 nm.

Cooper pair should be stabilized by an attractive potential. Little proposes chemically coupled electronically polarizable moieties for this purpose. Chemical bonding with CNTs at required density might destroy electrical conductivity. Ginzburg et al., study also possibility of placing electronically polarizable groups in the vicinity of a conductor without chemical bond. In order to achieve significant polarization, the group should be quite large, perhaps 1 nm or more. If the allowed space along long axis of the CNT is 0.74 nm or less, the polarizable group should be more or less perpendicular against the CNT. This would render the coupling between the CNT and polarizable group weak and ineffective.

Zig-zag CNTs are discussed in more detail. Based on these considerations inventors further conjured that pointlike positive charge epitaxially placed at distances of 0.74 nm along the long axis of a CNT would be better alternative than electronically polarizable group for the stabilization of a Cooper pair. Proton, or chemically bonded hydrogen atom is an obvious choice. Hydrogen atom should have a partial positive charge, like in hydroxyl group, in which the charge can be about one fifth of the elementary charge. Positive charges should be immobilized enough so that spin density wave is stable. One way to achieve this is to bind positive charges with polymeric backbone. Polymer should be flexible enough to wrap around of a CNT, but rigid enough so that charged groups do not move too much. Polymer should be so flat, and hydrophobic at least on one side so that it has good interaction with a CNT. Further requirement is 0.74 nm periodicity. Inventors performed molecular dynamics studies, and found that natural compound xylan fulfills all these requirements especially, if the diameter of the CNT is about 2-4 nm. Single walled nanotubes (SWNT) have generally smaller diameter than 2 nm, and multiwalled nanotubes (MWNT) have bigger diameter than 4 nm. Double walled nanotubes (DWNT) have diameters typically between 2-4 nm. Inner wall may also be useful for the conductivity especially, if it has the same chirality than the outer wall. If there are more than two walls, the probability of mismatch increases. In both armchair and zig-zag DWNTs both tubes may have same periodicity along long axis; armchair outer tube (n,n), and inner tube (n-5,n-5); zig-zag outer tube (n,0), and inner tube (n-9,0). These are calculated values based on the spacing of graphene planes in graphite.

Natural xylan has side chains that may not be beneficial for the present invention, although it is supposed that the backbone is against a CNT, and side chains are pointing outward. Xylan can also be produced without side chains (Mortimer J. C., et al., Proc. Natl. Acad. Sci., 107 (2010) 17409), or alternatively side chains may be hydrolyzed at least partially away.

Water soluble xylan has been previously used to disperse CNTs into water. SWNTs and MWNTs were dispersed, and it is possible that DWNTs were not tested. Present inventors do not use water-soluble xylan but instead xylan in slightly acidic milieu. Water-soluble xylan is alkali metal salt of xylan. Both forms of xylan may give equal results.

Similar reasoning may show that cellulose is better suited for armchair CNTs, because separation of cellulose molecules in cellulose crystal is 0.835 nm, i.e., very close to one possible periodicity 0.85 nm of armchair CNTs.

Proving that material is superconducting is very complicated. Resistance should, of course, be zero. Experiments can only prove that resistance is below some very small value. Four point measurement is recommended for accurate resistance measurements. Two point measurements may give a significant apparent resistance, because the energy gap is twice the stabilization energy $\Delta_g$ of Cooper pair, and the voltage over the conducting film and electrode should be able to break the Cooper pair. Thus, two point measurements, or modified four point measurements can give the energy gap $\Delta_g$. Magnetic effects are equally important than zero resistance, and energy gap for proving superconductivity.

SUMMARY OF THE PRESENT INVENTION

Room temperature superconductivity could have enormous technical and economical implications. Room temperature superconductors may replace normal electric conductors almost in all applications, because cooling is not necessary, or it may be done by refrigerator, in order to guarantee uninterrupted operation. World wide energy savings could be tens of billions of dollars every year.

Another major application of superconductors is the fabrication and use of strong electromagnets.

Still another application of superconductors is levitation.

New kind of electronics will be possible at room temperature, for example, superconducting transistors.

Superconductors could be used virtually in all electromagnetic applications.

DETAILED DESCRIPTION

Definitions

Low dimensional conductor: One dimensional, quasi two-dimensional, or two dimensional conductor.

Graphitic material: Material that consists of $sp^2$-hybridized carbon hexagons, for example, graphite, graphene, and carbon nanotubes. The edges, or ends of graphitic material may contain other atoms than carbon.

Chiral CNTs: CNTs can be mathematically constructed from rectangular graphene sheets by rolling equivalent carbon atoms together. The position of these equivalent carbon atoms are given by hexagonal coordinates (n,m) that define the chirality of any given CNT.

Zig-zag CNT: Hexagonal coordinates are (n,0).

Armchair CNT: Hexagonal coordinates are (n,n).

Epitaxial: Overlayer has well defined orientation with respect to substrate structure, and is commensurate with the substrate.

Flexible: In this description flexible film or device can have a radius of curvature less than 1 cm, while maintaining electrical properties.

DETAILED DESCRIPTION OF THE PRESENT INVENTION

Figure 1:
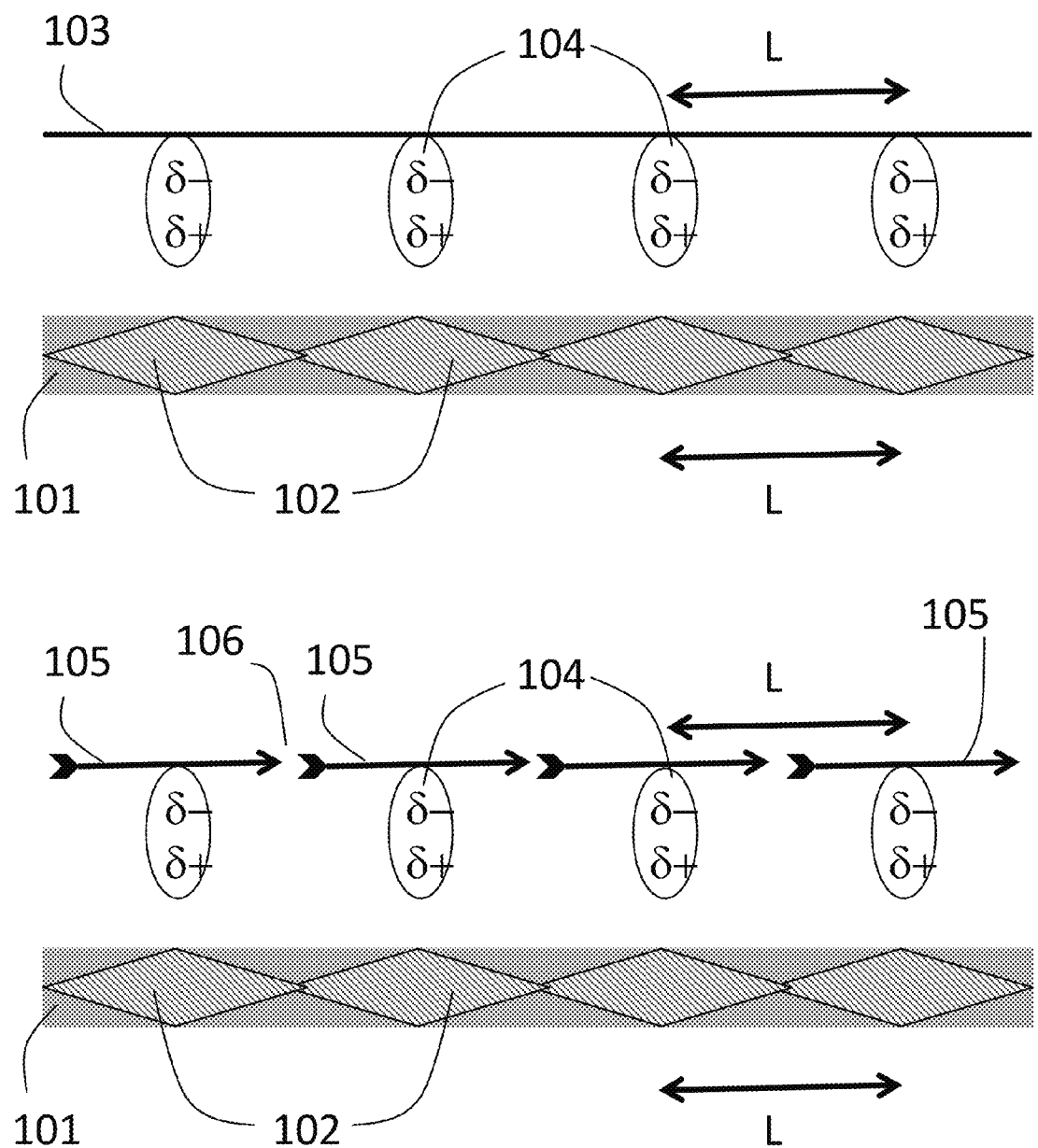
FIG. 1. Schematic depiction of one dimensional conductor, and epitaxial polymer that has partial positive charges.

In FIG. 1 is depicted a general principle of the present invention. A low dimensional conductor 101 is coated epitaxially by a polymeric material, i.e., both have repeating unit that has the same length L. Polymer may have a backbone 103, and polar side-chains, or groups 104. In the general case conducting material may be metal, semimetal, semiconductor, ceramic, or organic conductor. Polymer may be covalent polymer (FIG. 3A), inorganic, or supramolecular polymer (FIG. 3B), i.e., assembled in situ from smaller units 105 using supramolecular chemistry, for example using hydrogen bonds, coordination bonds, or charge transfer interaction 106. Polymer may wrap around the conductor, for example, helically. This kind of structure may support the formation of Cooper pairs especially, if the epitaxial lattice constant, i.e., the periodicity along the conduction path, if somewhat shorter than the Fermi wavelength, although this statement should only considered as a guideline, and not limiting the present invention.

Figure 2:
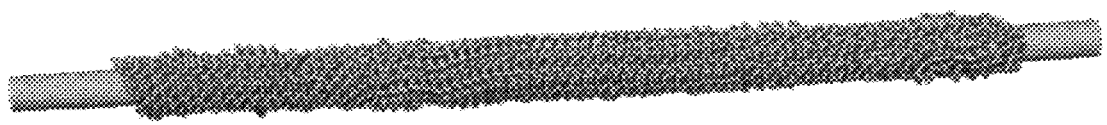
FIG. 2. One schematic embodiment of the present invention. Interaction of xylan and CNT.

FIG. 2 depicts one specific embodiment of the present invention. Graphitic material, CNT 201 in FIG. 2, is dispersed into water using polysaccharide, such xylan 202, as a dispersant. Xylan forms a twisted helix around the CNT. Vicinal xylose units are further bound with hydrogen bonds. Dispersion may require external energy source, such as ultrasonic vibrator (sonotrode), or high pressure hydrodynamic injection. Graphitic material may be coated with a very thin submonolayer of xylan that allows close proximity between various particles of graphitic material.

Single walled (SWNT), double walled (DWNT), or multiwalled (MWNT) CNTs may be used in the context of the present invention. Currently, the best results have been obtained with DWNTs.

Xylan is a polymer of xylose, and has also side chains that contain other pentoses, including arabinose, and methyl glucuronic acid. Plants may be genetically engineered so that xylan is essentially pure polyxylose, i.e., it does not have branches. All five hydroxyl groups are equatorial in xylose. Two are used to form glycosidic bond, and three remain free. Accordingly, xylan is as flat as a polysaccharide can be. Importantly, xylan may coat a CNT epitaxially, i.e., periodicities of xylan and CNT are commensurate.

Figure 7:
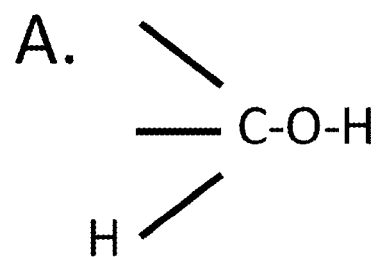
FIG. 7. Some possible molecular moieties and functional groups.
Figure 7:
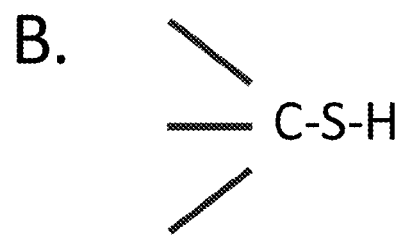
Figure 7:
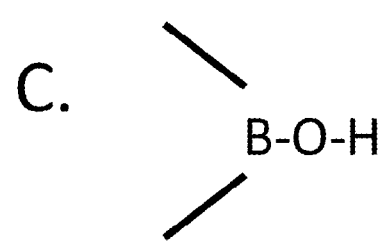
Figure 7:
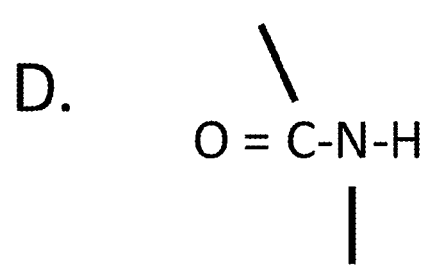
Figure 7:
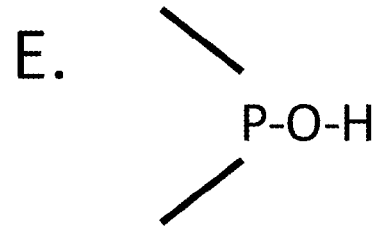
Figure 7:
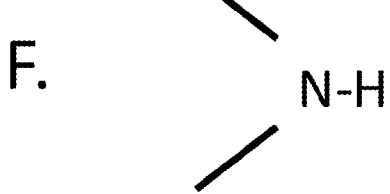
Figure 7:
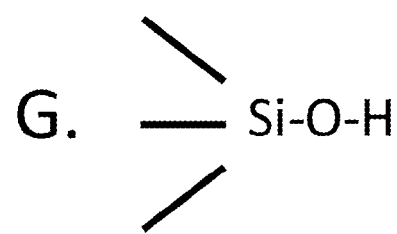

Hydroxyl groups may interact with $\pi$-bond cloud of CNT. Vibrational frequency of OH-bond is about $10^{14}$ Hz. Hydroxyl vibration may serve the same role as phonons in traditional superconductors. Vibrational frequency may optimally be between $5\times10^{13}$-$5\times10^{14}$ Hz. Chirality of xylan may also be important. Xylan is chirally pure, and this is important for periodic placement of hydroxyl groups on the surface of a DWNT. Also xylan is semirigid, i.e., fairly rigid rings are connected by oxygen bridges that are flexible. Small flexibility may be important for epitaxial coating of DWNTs. Xylan may be compared with polyvinyl alcohol. Polyvinyl alcohol has actually higher density of hydroxyl groups, and they are also chiral. However, fabrication of chirally pure PVA is extremely difficult. Chiral purity of 95% might be good enough for some purposes. However, chiral purity over 99% is preferred. Also PVA might be too flexible for maintaining epitaxial coating. This example is intended to demonstrate that xylan may be very close to an ideal molecule for the stabilization of Cooper pairs. Still molecules that are like PVA may also work. It is possible to design artificial molecules that are achiral, semiflexible like xylan, and have hydroxyl or some other corresponding groups (FIG. 7).

However, other explanations may be possible, and the present invention is not limited by this interpretation.

Sample preparation method is also important for the currently favored embodiment. Dilute dispersions, between 0.05-0.005 wt % give good results. Also the film thickness may advantageously be 2-200 nm, more advantageously 10-40 nm One explanation is that CNTs are not entangled in a very dilute dispersion, and may be relatively straight. In a very thin layer the CNTs may be parallel with the substrate. After drying more dispersion may be added. The CNTs may still be oriented by external force field, such as electric, magnetic, or shear field.

Superconductivity can be observed by several measurements. Most obvious might be resistance. However, measurement device wires, and contacts have resistances, and those should be subtracted. This leaves some uncertainty. Detection of Cooper pair formation is considered more reliable method. Type I superconductors are also perfect diamagnets, i.e., they are impermeable for magnetic field. Type II superconductors are partially permeable for magnetic field. The materials of this invention are locally anisotropic, and heterogeneous. It is expected that magnetic field may penetrate partially the materials of this invention.

Figure 3:
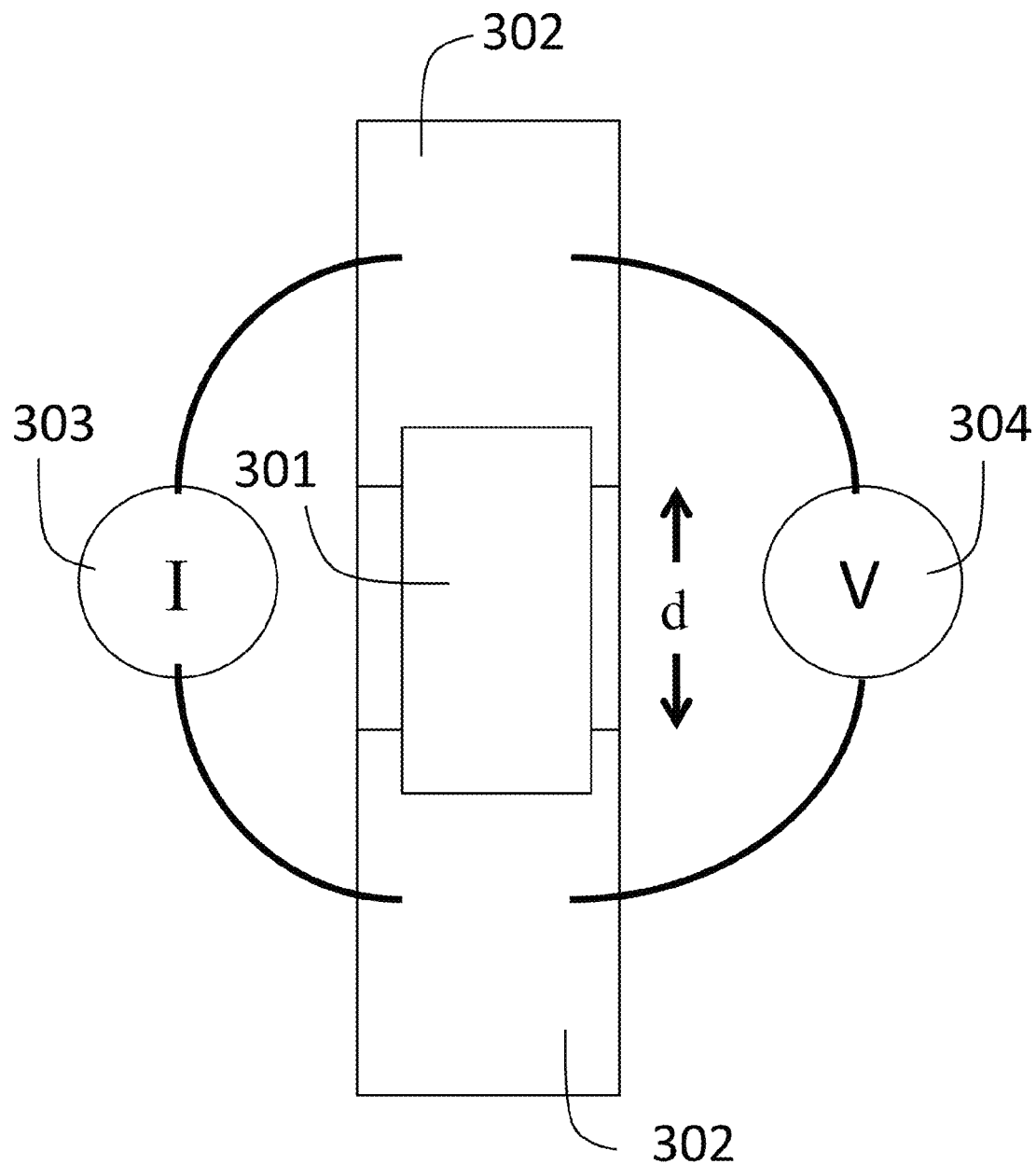
FIG. 3. Schematics of the experimental setup for the measurement of potential gap, modified four point measurement.

The most reliable test for the proving of superconductivity in the present case is the detection of Cooper pairs. Very simple method is a modified four point measurement using only two inert metal electrodes (FIG. 3). If the sample is metallic, current starts to flow linearly as a function of potential. Semiconductors have a band gap, and potential should exceed the band gap before any significant current will be observed. When current starts to increase it follows more or less monotonous curved line. Band gap is typically between hundred millivolts and 3 V. Superconductors have highly characteristic behavior (See Tinkham, pp. 70-78, Kittel, Introduction to Solid State Physics, S Ed., p. 389). First, when voltage is increased slightly, there is no current. Reason for this is that Cooper pairs have stabilization energy $\Delta_g$, and they can not be transferred into normal metal form a superconductor without energy input that will break a Cooper pair into two separate electrons. This energy is typically in $\mu V$ or mV range. When the potential is sufficient for breaking of Cooper pairs, the current will increase very fast, almost parallel with I-axis in potential-current graph. When limiting current is reached, the potential-current graph will look like normal ohmic graph.

Breaking of Cooper pairs requires a certain potential that corresponds to $2\Delta_g$. For a certain superconductor $\Delta_g$ is a function of temperature. This function is well known for BSC theory. In one embodiment of the present invention $\Delta_g$ is 15 mV at 293 K. This is fairly small value compared to room temperature kT that is 25 meV, but $\Delta_g$ is zero at $T_c$, and will be smaller than kT, when temperature is approaching $T_c$.

DWNTs were about 5 µm long in this embodiment. The distance d (FIG. 3) between gold electrodes was either 100 µm, 1.2 mm, or 12.5 mm in Example 2, and there was at least 20, 240, or 2500 different DWNTs in each conduction path, correspondingly. Remarkably, the potential gap was almost independent of the distance of the gold electrodes, i.e., 15-17 mV, when measurements were done using different batches of xylan-DWNT, and different substrates. The observed values for potential gap were within 20% of each other.

When CNTs are normal conductors, the contacts between CNTs may be tunnel contacts. If these remain tunnel contacts also at superconducting state these are Josephson junctions. One remarkable property of Josephson junctions is that they may emit electromagnetic radiation even when DC current is applied. Radiation is typically in MHz range. However, no electromagnetic radiation was observed for the material of this invention in 10 kHz-2 GHz range, when current density was 20 A $mm^{-2}$. There may be no energy loss through radiation, and also the contacts may be superconducting. Radiation may still happen outside the studied range.

Combined these observations support room temperature superconductivity of CNT-xylan nanocomposite.

Xylan is a chiral molecule that is isolated and purified from natural sources. Optical purity is very high, and may be 100%. This is beneficial for epitaxial coating. Although no accurate limit for optical purity is known presently, it is advantageous, if the optical purity is more than 90%, and more advantageous, if it is more than 99%.

One essential feature of the present material is fast, polarized oscillator that is in close proximity of a CNT (FIGS. 1 and 2). In this example the oscillator is a hydroxyl group. Analogous oscillator may be formed, when hydrogen atom is bonded with an electronegative atom. Bonding may be advantageously covalent, because strong bond between light hydrogen and heavier atom vibrates at high frequency. Nonlimiting examples of possible oscillators are OH, SH, NH, $NH_2$, $NH_3^+$, PH, and $PH_2$. These functional groups may be attached with organic, or inorganic molecules. Some examples are in FIG. 7. Hydrogen atom in C—H may also be enough polarized, if carbon atom is also bonded with electronegative atom such as oxygen (FIG. 7A).

Instead of xylan many other natural, modified, or synthetic polysaccharides may be used. Most notably, plants can be genetically engineered to produce xylan that has pure polyxylose backbone and no side-chains (Mortimer J. C., et al., Proc. Natl. Acad. Sci., 107 (2010) 17409). Also acid hydrolysis removes side-chains preferentially, and polyxylose backbone is only slightly fragmented (Stepan A. M., et al., J. Appl. Polym. Sci., 125 (2012) 2348).

DWNTs have so far been superior for the fabrication of room temperature superconductors. However, graphene, bilayer, or multilayer graphene may have analogous behavior.

In most applications the CNT dispersion will be spread on a solid surface. Many painting and printing methods can be used. One currently preferred method is spraying. Commonly nozzles will be used. Ultrasonic vibration enables nozzle free spraying. Ultrasonic vibration may also be used with nozzles. Other spraying techniques include gas pressure assisted spraying and electrospraying. Currently, electrospray is favored, because the CNTs will be (preferably negatively) charged. Charged CNTs will be maximally separated inside a droplet, and ideally also oriented. Orientation can be further assisted by external electric or magnetic field that can be static or oscillating.

Voltage Sensitive Device

Figure 4:
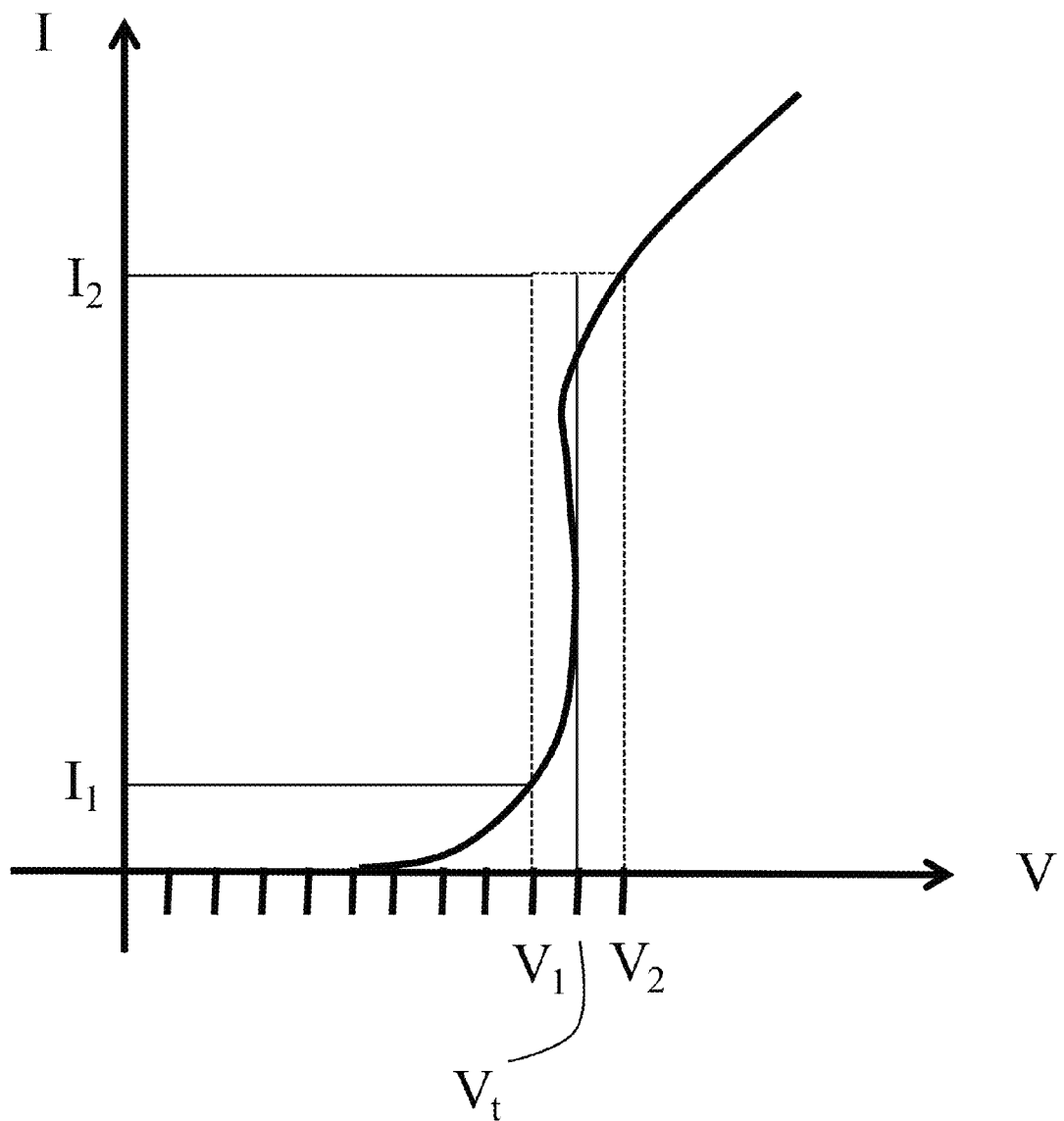
FIG. 4. Schematic I-V curve having strong increase of current from $I_1$ to $I_2$ at certain narrow potential range $V_1$-$V_2$.

Transistor amplifies current, when the potential is changed only slightly. Transistors have three contacts at room temperature: emitter, collector, and base. In the field effect transistors the base is not a part of a conduction path. A schematic I-V curve of the present invention is depicted in FIG. 4. Around a certain threshold voltage $V_t$ the current increases abruptly. The fast change happens almost completely in the interval $(V_1, V_2)$, in which $V_1=(1-p)*V_t$, and $V_2=(1-p)*V_t$. In other terms ±100*p is the percentage change of $V_t$ that gives $V_1$, or $V_2$. First, the purpose is to find maximum ratio $I_2/I_2$, when p is constant, and then p can be minimized. Optimization goals really depend on final application. Sometimes the minimization of p or $I_1$ might be more important than $I_2/I_1$.

Figure 5:
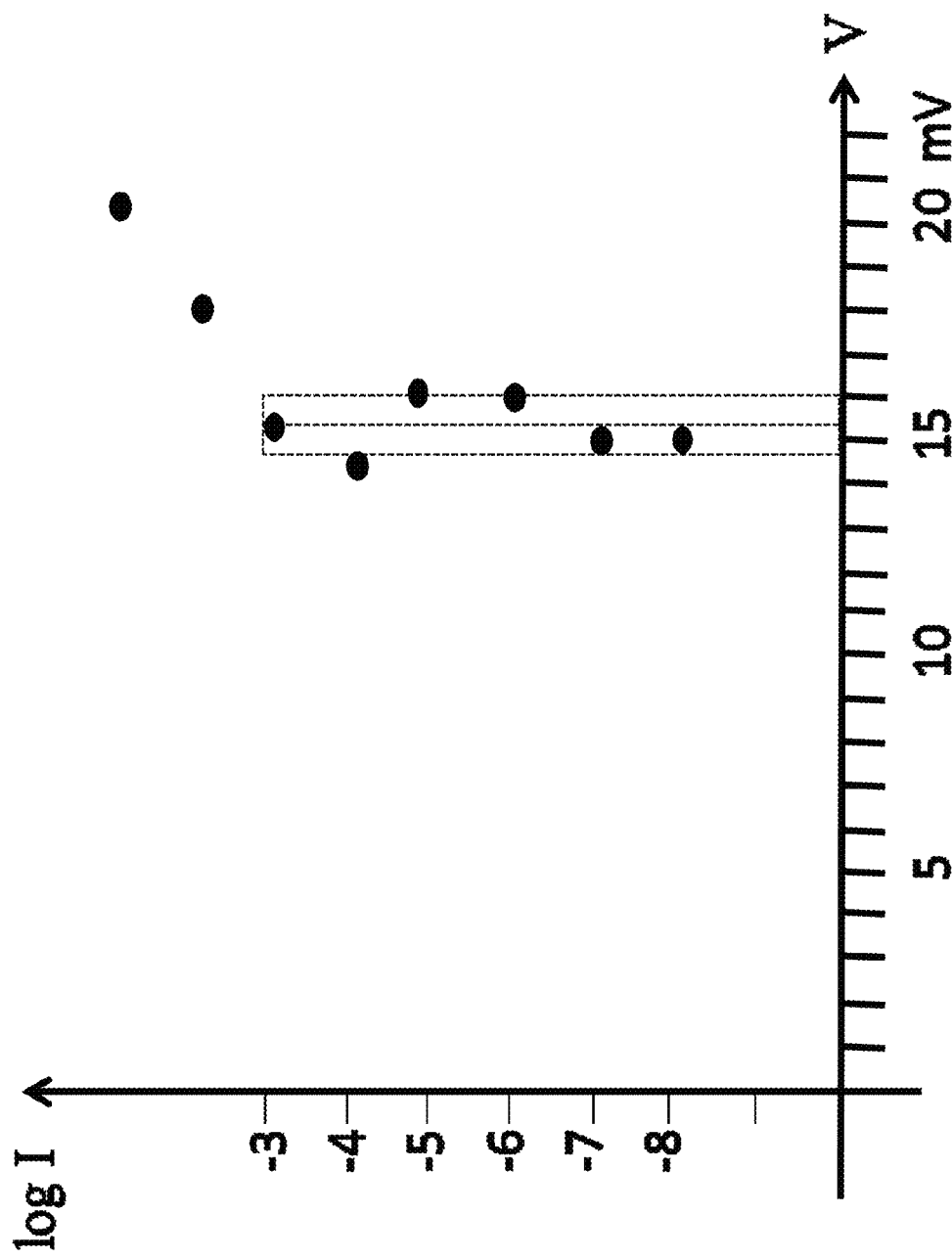
FIG. 5. Log(I)-V curve for xylan-DWNT film.
Figure 6:
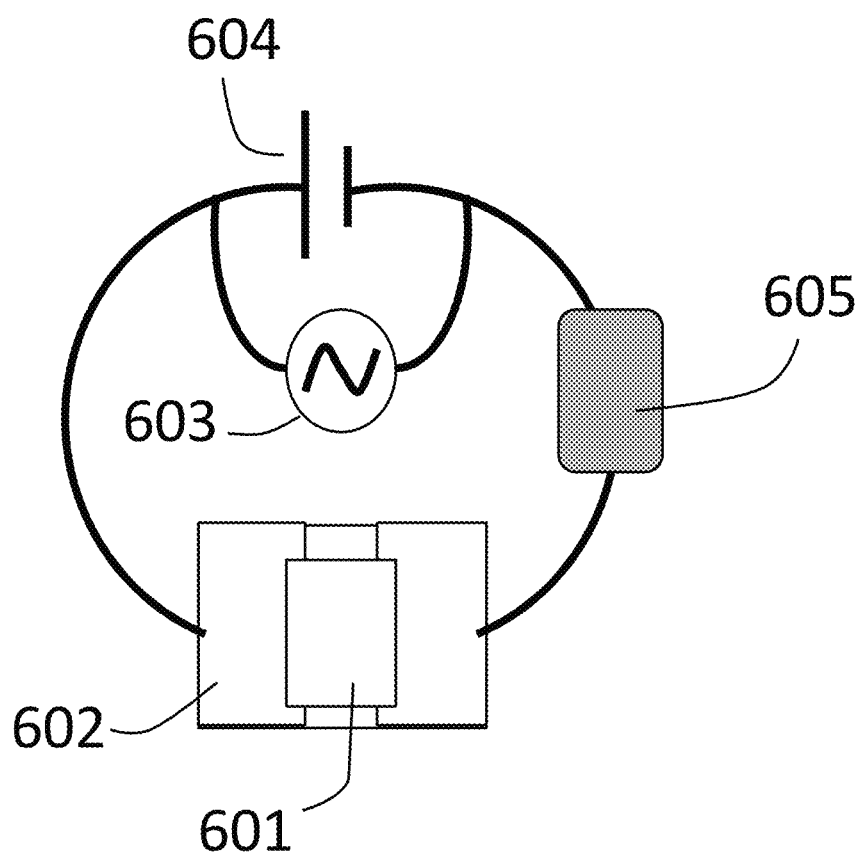
FIG. 6. One embodiment of a device of this invention.

One embodiment of the present invention is a voltage sensitive device consisting of the film 601, and the electrodes 602 (FIG. 6), in which device the current can change more than three orders of magnitude, when the potential is changed slightly, for example, ±10% or less. Experimentally inventors have been able to change the current five orders of magnitude by changing the voltage less than ±5% at room temperature (FIG. 5, compare C. Kittel, Introduction to Solid State Physics, $5^{th}$ Ed., p. 389). This device represents a new kind of switch, or transistor at room temperature. Device can have a certain threshold bias voltage 604, and a variable very small voltage 603 is superimposed. Current will change very strongly in the circuit that may contain a current sensitive component 605 that may be a part of a large circuitry. The gain of this transistor is the ratio of voltages 604 and 603, i.e., 1/p, which in this example is between 10 and 20.

The thickness of the film 601 may be less than 100 nm. In some applications the thickness may be less than 40 nm so that the film is also optically transparent. Transmittance percent more than 90% has been measured, while maintaining electrical properties. This kind of devices can be used, for example, in displays and solar cells.

In many applications flexibility is important. The material of this invention enables the fabrication of flexible devices, if the substrate is flexible like thin plastic or very thin glass.

EXPERIMENTAL DETAILS

While this invention has been described in detail with reference to certain examples and illustrations of the invention, it should be appreciated that the present invention is not limited to the precise examples. Rather, in view of the present disclosure, many modifications and variations would present themselves to those skilled in the art without departing from the scope and spirit of this invention. The examples provided are set forth to aid in an understanding of the invention but are not intended to, and should not be construed to limit in any way the present invention.

Example 1

100 mg of DWNTs (Unidym, Sunnyvale, Calif.) were added into 1000 ml of water that was acidified to pH 5 with acetic acid. The mixture was hydrodynamically processed one cycle (LV1 Microfluidizer Processor IDEX Material Processing Technologies Group), and 100 mg of xylan was added. After three cycles polycarbonate sheet was covered with 0.2 mm thick layer, and dried. Calculated thickness of the layer was 40 nm. Transmittance was over 90%.

Example 2

8 g of MWNTs (SWeNT, Norman, Okla.) and 3.2 g xylan were added into 200 ml of water, and mixed first mechanically. The mixture was hydrodynamically processed three times (LV1 Microfluidizer Processor IDEX Material Processing Technologies Group) using pressure of 500 bar.

Example 3

The center of a 25 mm×75 mm microscope slide was covered with 100 μm fiber, 1.2 mm, or 12.5 mm kapton tape. First, 5 nm layer of titanium was evaporated, and then 20 nm layer of gold 302 (FIG. 3). Fiber, or tape was removed, and both sides of the slide were covered with 6.25 mm kapton tape. Xylan-DWNT dispersion (1.5 ml) from Example 1 was pipetted onto the slide, and water was allowed to evaporate slowly. Schematics of the slide, and the film 301 is in FIG. 3. I-V graph was measured using Keithley 6882A DC Current Source 303, and Keithley 2182A Nanovoltmeter 304. The current was increased from 10 nA to 10 mA by one order of magnitude at each step. The result was surprisingly similar for all three samples, and is depicted in FIG. 5. The voltage was almost constant 15.2±0.75 mV from 10 nA to 1 mA, i.e., five orders of magnitude current change.

MWNT dispersion had ohmic behavior.

The invention claimed is:

1. A device, comprising:
   a substrate;
   a first electrode;
   a second electrode; and
   an electrically conducting material that electrically connects said first and second electrodes,
   wherein said device has a narrow voltage range, in which the difference between the lower and higher voltages is less than 10%,
   wherein the current will increase at least one thousand-fold within said voltage range while the temperature is essentially constant at 290 K.

2. A device of claim 1, in which said lower and higher voltages depend less than 20% on a distance between said first and second electrodes when said distance is between 0.1-10 mm.

3. A device of claim 1, in which said current will increase at least ten thousand-fold within said voltage range.

4. A device of claim 3, in which said current will increase at least one hundred thousand-fold within said voltage range.

5. A device of claim 4, in which said difference between said lower and higher voltages is less than 5%.

6. A device of claim 1, in which said electrically conducting material is in a form of a thin film connecting said first and second electrodes, and wherein the thickness of said film is less than 100 nm.

7. A device of claim 6, in which said film has a thickness of less than 40 nm, and wherein the film has a transmittance percent of more than 90% for visible light.

8. A device of claim 1, in which said substrate and electrically conducting material are flexible.

9. A material used to fabricate the device of any of claim 1, 2, 3, 4, 5, 6, 7, or 8.

10. A material of claim 6, which contains graphitic material.

11. A material of claim 10, in which said graphitic material consists of carbon nanotubes.

12. A material of claim 11, in which said carbon nanotubes are double walled carbon nanotubes.

13. A material of any of claim 10, 11, or 12 that contains a polymer that has polarizable side-chains or functional groups.

14. A material of claim 13, in which said side-chains or functional groups contain polarized hydrogen atoms.

15. A material of claim 14, in which said electrically conducting material and said polymer bind epitaxially with each other.

16. A material of claim 15, which contains xylan, acid treated xylan, or polyxylose.

* * * * *